United States Patent [19]

Matsumoto

[11] Patent Number: 5,691,233
[45] Date of Patent: Nov. 25, 1997

[54] PROCESS OF FORMING CHANNEL STOPPER EXACTLY NESTED IN AREA ASSIGNED TO THICK FIELD OXIDE LAYER

[75] Inventor: Shigeharu Matsumoto, Tokyo, Japan

[73] Assignee: NEC Corporation, Tokyo, Japan

[21] Appl. No.: 635,731

[22] Filed: Apr. 22, 1996

[30] Foreign Application Priority Data

Apr. 28, 1995 [JP] Japan ................................. 7-129312

[51] Int. Cl.$^6$ ................................................. H01L 21/76
[52] U.S. Cl. ................................................. 437/69; 437/80
[58] Field of Search ................................. 437/63, 69, 70, 437/36, 80; 148/DIG. 85, DIG. 86, DIG. 817

[56] References Cited

U.S. PATENT DOCUMENTS

| | | |
|---|---|---|
| 4,840,920 | 6/1989 | Suda . |
| 5,208,181 | 5/1993 | Chi . |
| 5,372,951 | 12/1994 | Anjum et al. ................. 437/70 |

FOREIGN PATENT DOCUMENTS

| | | |
|---|---|---|
| 57-039511 | 3/1982 | Japan . |
| 4-253339 | 9/1992 | Japan . |

OTHER PUBLICATIONS

"Isolation Characteristics of Improvement LOCUS Using ITF".

*Primary Examiner*—George Fourson
*Attorney, Agent, or Firm*—Laffe, Whitesel, Conte & Saret, Ltd.

[57] ABSTRACT

An obstacle layer is grown on an inner surface of a mask structure defining a first opening over a first area assigned to a thick field oxide layer during a growth of the thick field oxide layer, and prevents a silicon substrate beneath a peripheral area of the thick field oxide layer from a dopant impurity implanted through the thick field oxide layer into the silicon substrate beneath the central area of the thick field oxide layer so that a channel stopper is never exposed to a major surface of the silicon substrate outside of the thick field oxide layer.

10 Claims, 8 Drawing Sheets

PROCESS OF FORMING CHANNEL STOPPER EXACTLY NESTED IN AREA ASSIGNED TO THICK FIELD OXIDE LAYER

FIELD OF THE INVENTION

This invention relates to a process of forming an isolating region in a semiconductor device and, more particularly, to a process of forming a channel stopper exactly nested in an area assigned to thick field oxide layer.

DESCRIPTION OF THE RELATED ART

A typical example of the isolating process is known as LOCOS (local oxidation of silicon), and FIGS. 1A to 1D illustrate the prior art process sequence. First, a p-type silicon substrate 1 is prepared, and a thin silicon oxide layer 2 is grown on the major surface of the p-type silicon substrate 1. Silicon nitride is deposited over the entire surface of the thin silicon oxide layer 2, and the thin silicon oxide layer 2 is overlain by a silicon nitride layer 3.

Photo-resist is spread over the entire surface of the silicon nitride layer 3, and the photo-resist layer is patterned into a photo-resist etching mask 4 by using the lithographic techniques. The photo-resist etching mask 4 has an opening 4a, and an area of the silicon nitride layer 3 over a region assigned an isolating region is exposed to the opening 4a.

Using the photo-resist etching mask 4, the silicon nitride layer 3 is selectively etched away, and an area of the thin silicon oxide layer 2 over the region is exposed to an opening 3a formed in the silicon nitride layer 3 as shown in FIG. 1A.

Subsequently, p-type dopant impurity is ion implanted through the opening 3a into the region assigned the isolating region, and forms a heavily doped p-type channel stop region 1a in the p-type silicon substrate as shown in FIG. 1B.

The photo-resist mask 4 is stripped off, and a thick silicon oxide layer 5 is thermally grown in oxidation atmosphere. The silicon nitride layer 3 prevents the p-type silicon substrate 1 thereunder from the oxidation atmosphere, and the oxidation atmosphere can not increase the silicon oxide layer 2 beneath the silicon nitride layer 3 as shown in FIG. 1C.

Finally, the silicon nitride layer 3 and the thin silicon oxide layer 2 are etched away, and the thick silicon oxide layer 5 is left on the heavily-doped p-type channel stop region 1a as shown in FIG. 1D.

The heavily-doped p-type channel stop region 1a is expected to prevent the p-type silicon substrate 1 beneath the thick silicon oxide layer 5 from undesirable inversion. However, while the oxidation atmosphere is growing the thick silicon oxide layer 5, the p-type dopant impurity is diffused, and the diffusion decreases the p-type dopant concentration. If a p-type channel stop region is heavier in dopant concentration than another p-type channel stop region, the p-type channel stop region heavier than the other is effective against the undesirable inversion. Therefore, the heavily-doped p-type channel stop region 1a is liable to allow a punch-through phenomenon to take place.

A counter technology is disclosed by Wakamatsu et al. in "Isolation Characteristics of Improvement LOCOS Using ITF", the proceedings for the conference of Japan Applied Physics, 5p-A-7, 1988. FIGS. 2A to 2D illustrate the process sequence containing the post ion-implantation disclosed in the paper.

The prior art process sequence starts with preparation of a p-type silicon substrate 11, and a thin silicon oxide pad layer 12 is grown on the major surface of the p-type silicon substrate 11. Silicon nitride is deposited over the entire surface of the thin silicon oxide pad layer 12, and the thin silicon oxide pad layer 12 is overlain by a silicon nitride layer 13.

Photo-resist is spread over the entire surface of the silicon nitride layer 13, and the silicon nitride layer 13 is overlain by a photo-resist layer 14a. The p-type silicon substrate 11 is placed on a stage STG of an aligner AGN, and a reticle RCL1 is moved to a space over the photo-resist layer 14a. Light is radiated through the reticle RCL1 as shown in FIG. 2A, and the pattern for an isolating region is transferred from the reticle RCL1 to the photo-resist layer 14a. When the photo-resist layer 14a is developed, the photo-resist layer 14a is patterned into a photo-resist etching mask 14b. The photo-resist etching mask 14 has an opening 14a, and an area of the silicon nitride layer 13 over a region assigned the isolating region is exposed to the opening 14a.

Using the photo-resist etching mask 14b, the silicon nitride layer 13 is selectively etched away, and an area of the thin silicon oxide pad layer 12 over the region is exposed to an opening 13a formed in the silicon nitride layer 13 as shown in FIG. 2B.

The photo-resist mask 14b is stripped off, and a thick silicon oxide layer 15 is thermally grown in oxidation atmosphere. The silicon nitride layer 13 prevents the p-type silicon substrate 11 thereunder from the oxidation atmosphere, and the oxidation atmosphere can not increase the silicon oxide pad layer 12 beneath the silicon nitride layer 13 as shown in FIG. 2C.

The silicon nitride layer 13 and the thin silicon oxide pad layer 12 are etched away. Photo-resist is spread over the entire surface of the resultant structure, and the p-type silicon substrate 11 and the thick silicon oxide layer 15 are overlain by a photo-resist layer 16a. The p-type silicon substrate 11 is placed on the stage STG again, and a reticle RCL2 is moved to a space over the photo-resist layer 16a. Light is radiated through the reticle RCL2 as shown in FIG. 2D, and the pattern for a channel stopper region is transferred from the reticle RCL2 to the photo-resist layer 16a. When the photo-resist layer 16a is developed, the photo-resist layer 16a is patterned to a photo-resist ion-implantation mask 16b. The p-type silicon substrate 11 on both sides of the field oxide layer 15 is covered with the photo-resist ion-implantation mask 16b. P-type dopant impurity is ion implanted into the p-type silicon substrate 11, and the photo-resist ion-implantation mask 16b prevents the p-type silicon substrate 11 therebeneath from the p-type dopant impurity. As a result, a heavily doped p-type channel stop region 11a is formed beneath the thick field oxide layer 15 as shown in FIG. 2E.

Finally, the photo-resist ion-implantation mask 16b is stripped off, and the isolating region is occupied by the heavily doped p-type channel stop region 11a and the thick field oxide layer 15 as shown in FIG. 2F.

The ion-implantation is carried out after the growth of the thick field oxide layer 15, and the heavily-doped p-type channel-stop region 11a is maintained at a high dopant concentration. However, a problem is encountered in the prior art improved LOCOS process in that the heavily-doped p-type channel-stop region 11a' is deviated from the thick field oxide layer 15 as shown in FIG. 3. This is because of the fact that the photo-resist masks 14b and 16b independently define the area for the thick field oxide layer 15 and the area of the heavily-doped p-type channel-stop region 11a. Even if the patterns are transferred by using the same aligner AGN, the alignment between the reticles RCL1 and RCL2 is never perfect, and a mis-alignment is unavoidable. When the mis-alignment is serious, the photo-resist ion-implantation mask 16' uncovers a part of the p-type silicon substrate 11, and the heavily-doped p-type channel-stop region 11a' is exposed to the major surface of the p-type silicon substrate 11. If the heavily-doped p-type channel-stop region 11a' is partially overlapped with a channel region of a field effect transistor assigned to the active area on the right side of the thick field oxide layer 15, the threshold does not fall within a design range, and the field effect transistor becomes defective.

SUMMARY OF THE INVENTION

It is therefore an important object of the present invention to provide a process of forming an isolating region which perfectly nests a heavily doped channel-stop region in an area assigned to a thick field oxide layer.

In accordance with one aspect of the present invention, there is provided a process of forming an electrical isolation in a semiconductor layer of a first oxidizable material, comprising the steps of: a) forming a laminated structure including at least a first layer of a second oxidizable material and a second layer of an oxygen non-diffusable material over the semiconductor layer; b) patterning the laminated structure into a protection mask against an oxidation atmosphere having a first opening over a first area of the semiconductor layer assigned to a field oxide layer; c) exposing the semiconductor layer covered with the protection mask to an oxidation atmosphere so as to grow the field oxide layer on the first area and an obstacle layer on an inner surface of the first layer, the obstacle layer defining a second opening over a second area nested in the first area; d) ion implanting a dopant impurity through the field oxide layer into the second area by using the protection mask and the obstacle layer as an ion-implantation mask so as to form a channel stopper beneath the field oxide layer; and e) removing the ion-implantation mask from the semiconductor layer so as to leave the field oxide layer and the channel stopper in the semiconductor layer.

In accordance with another aspect of the present invention, there is provided a process of forming an electrical isolation in a semiconductor layer of an oxidizable material, comprising the steps of: a) forming a laminated structure including a first layer of an oxygen non-diffusable material and a second layer of a material different from the oxygen non-diffusable material on the semiconductor layer formed under the first layer; b) patterning the laminated structure into an ion-implantation mask having a first opening over a first area of the semiconductor layer assigned to a channel stopper; c) etching an inner peripheral portion of the second layer exposed to the first opening so as to expand a part of the first opening to a second opening over a second area of the semiconductor layer assigned to a field oxide layer, the first area being nested in the second area; d) growing the field oxide layer on the second area by exposing the semiconductor layer covered with the ion-implantation mask to an oxidizing atmosphere; e) ion implanting a dopant impurity through the field oxide layer into the first area so as to form the channel stopper beneath the field oxide layer; and f) removing the ion-implantation mask from the semiconductor layer so as to leave the field oxide layer and the channel stopper in the semiconductor layer.

BRIEF DESCRIPTION OF THE DRAWINGS

The features and advantages of the process according to the present invention will be more clearly understood from the following description taken in conjunction with the accompanying drawings in which.

DESCRIPTION OF THE PREFERRED EMBODIMENTS

First Embodiment

Figure 1A:
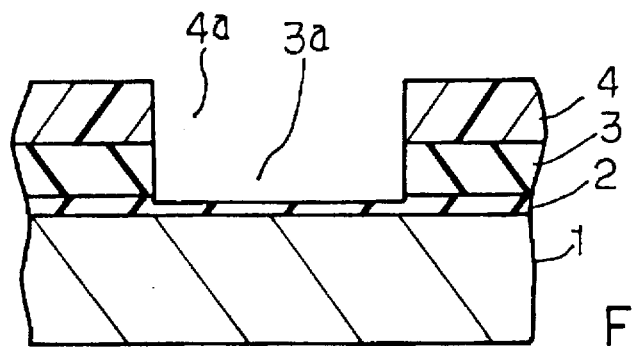
FIGS. 1A to 1D are cross sectional views showing the prior art LOCOS process.
Figure 1B:
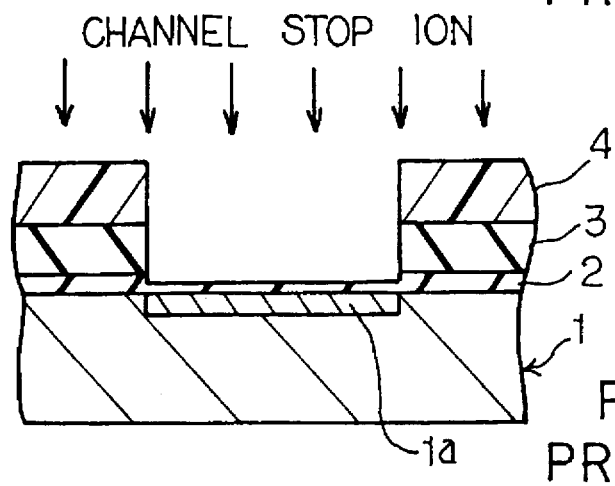
Figure 1C:
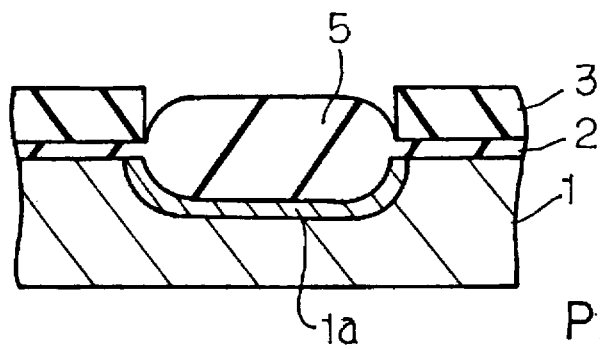
Figure 1D:
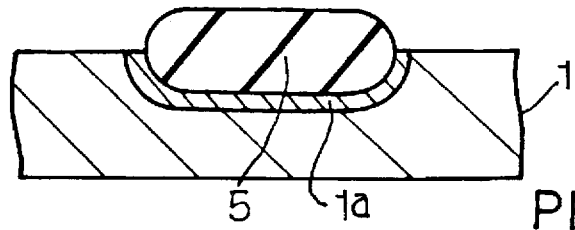
Figure 2A:
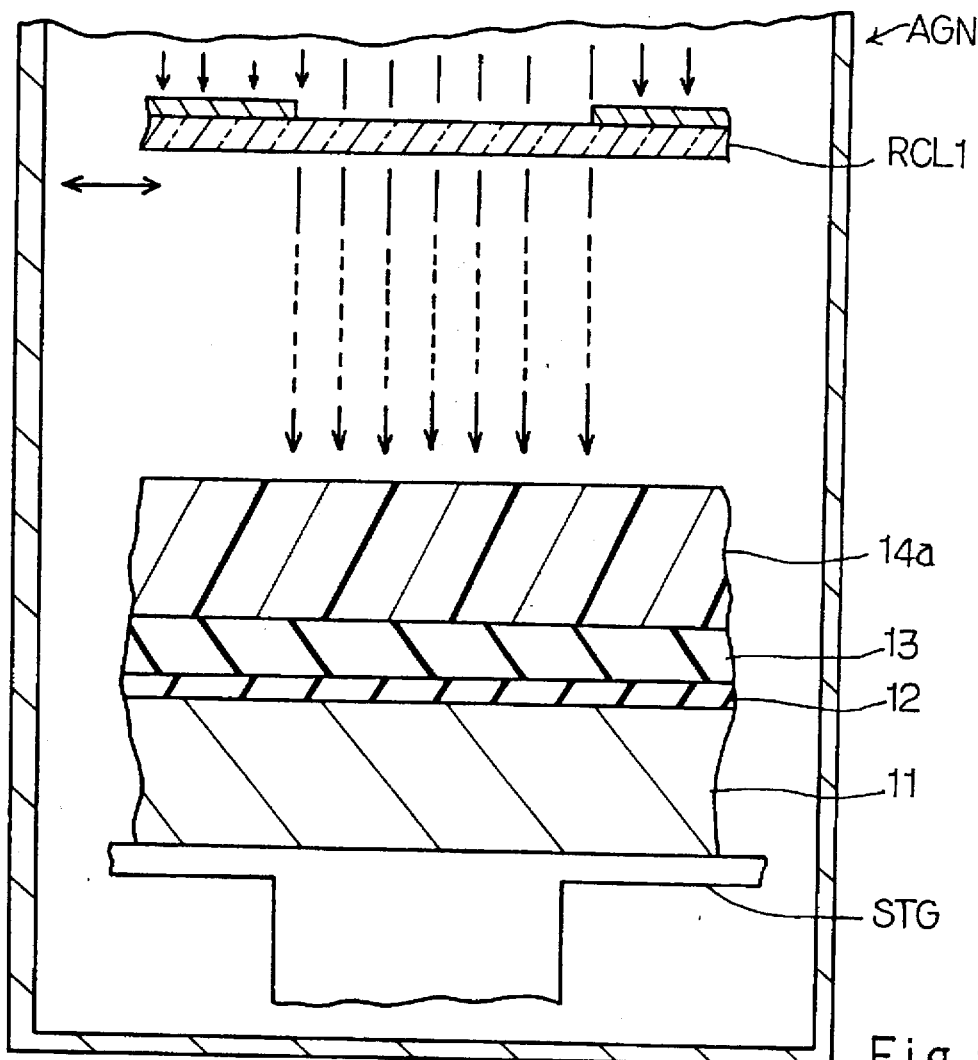
FIGS. 2A to 2F are cross sectional views showing the prior art improved LOCOS process.
Figure 2B:
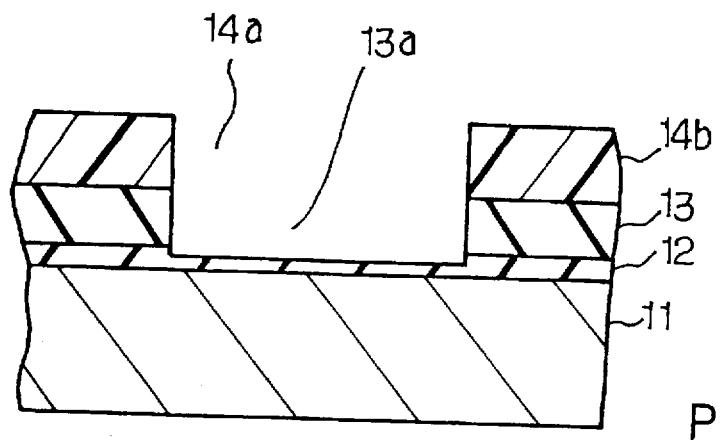
Figure 2C:
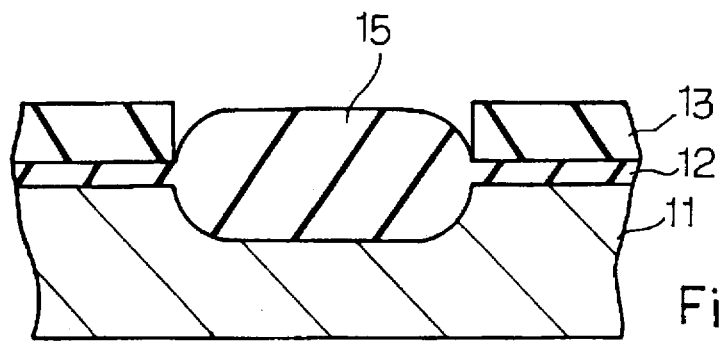
Figure 2D:
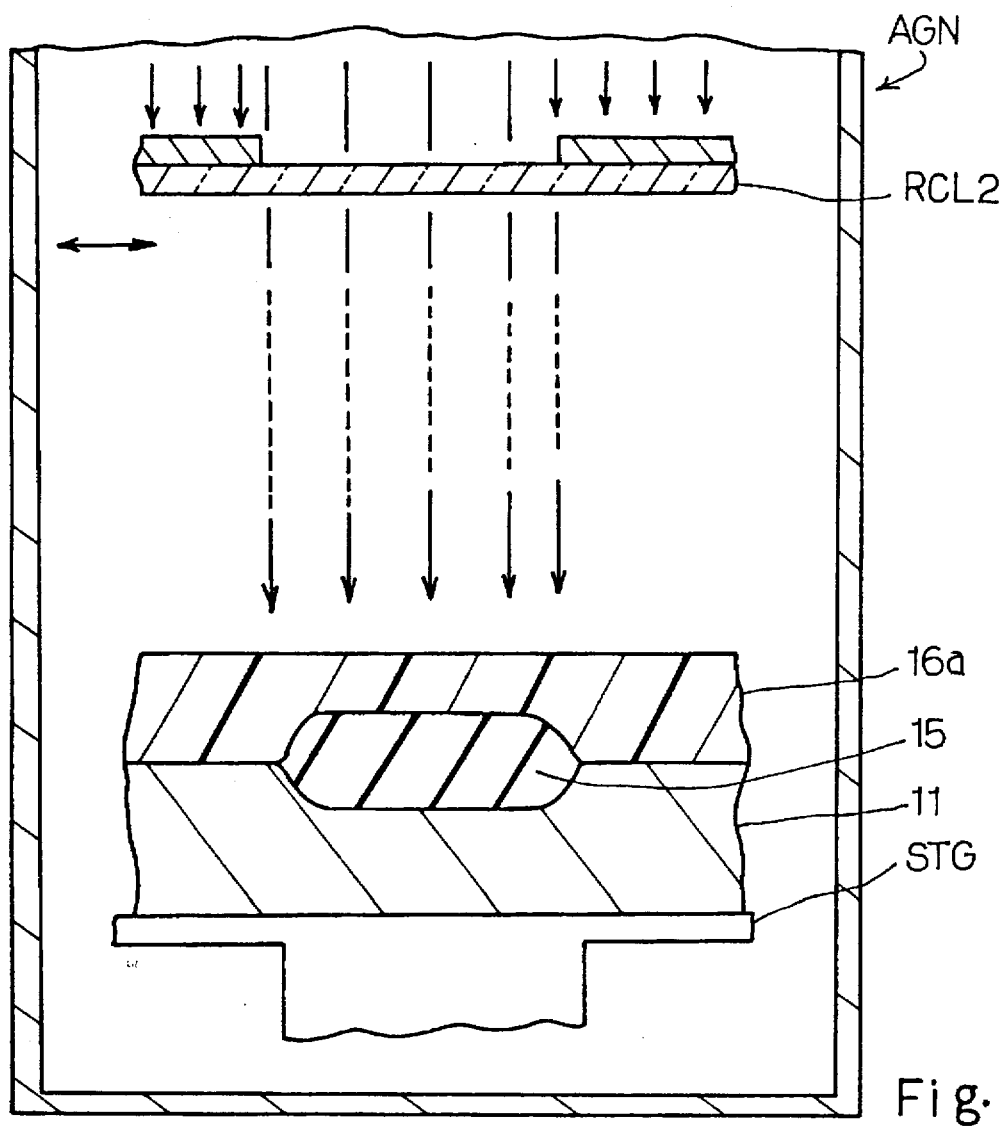
Figure 2E:
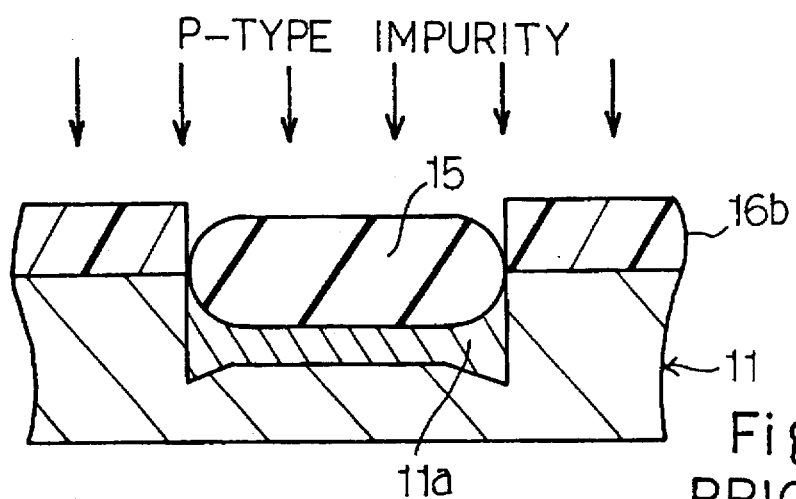
Figure 2F:
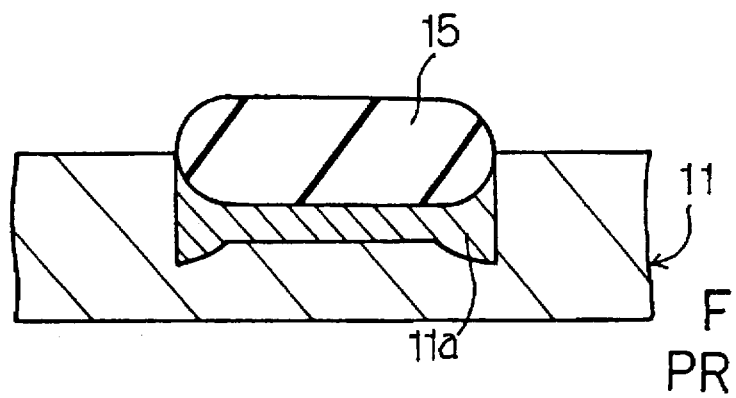
Figure 3:
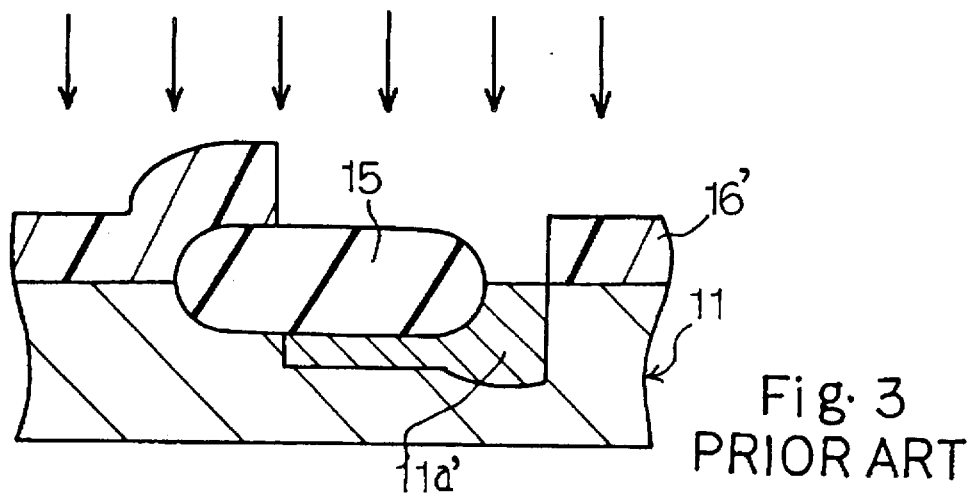
FIG. 3 is a cross sectional view showing the offset due to the mis-alignment of the mask in the prior art improved LOCOS process.

FIGS. 4A to 4E illustrate a process of forming an isolating region embodying the present invention. The process sequence starts with preparation of a p-type silicon substrate 21. The major surface of the p-type silicon substrate 21 is thermally oxidized, and a thin silicon oxide pad layer 22 is grown to 40 nanometers thick. Using chemical vapor deposition techniques, silicon nitride is deposited to 120 nanometers thick so as to cover the thin silicon oxide pad layer 22 with a first silicon nitride layer 23, thereafter, polysilicon is deposited to 400 nanometers thick so as to cover the first silicon nitride layer 23 with a polysilicon layer 24, and, finally, silicon nitride is deposited to 120 nanometers thick again so as to cover the polysilicon layer 24 with a second silicon nitride layer 25.

Figure 4A:
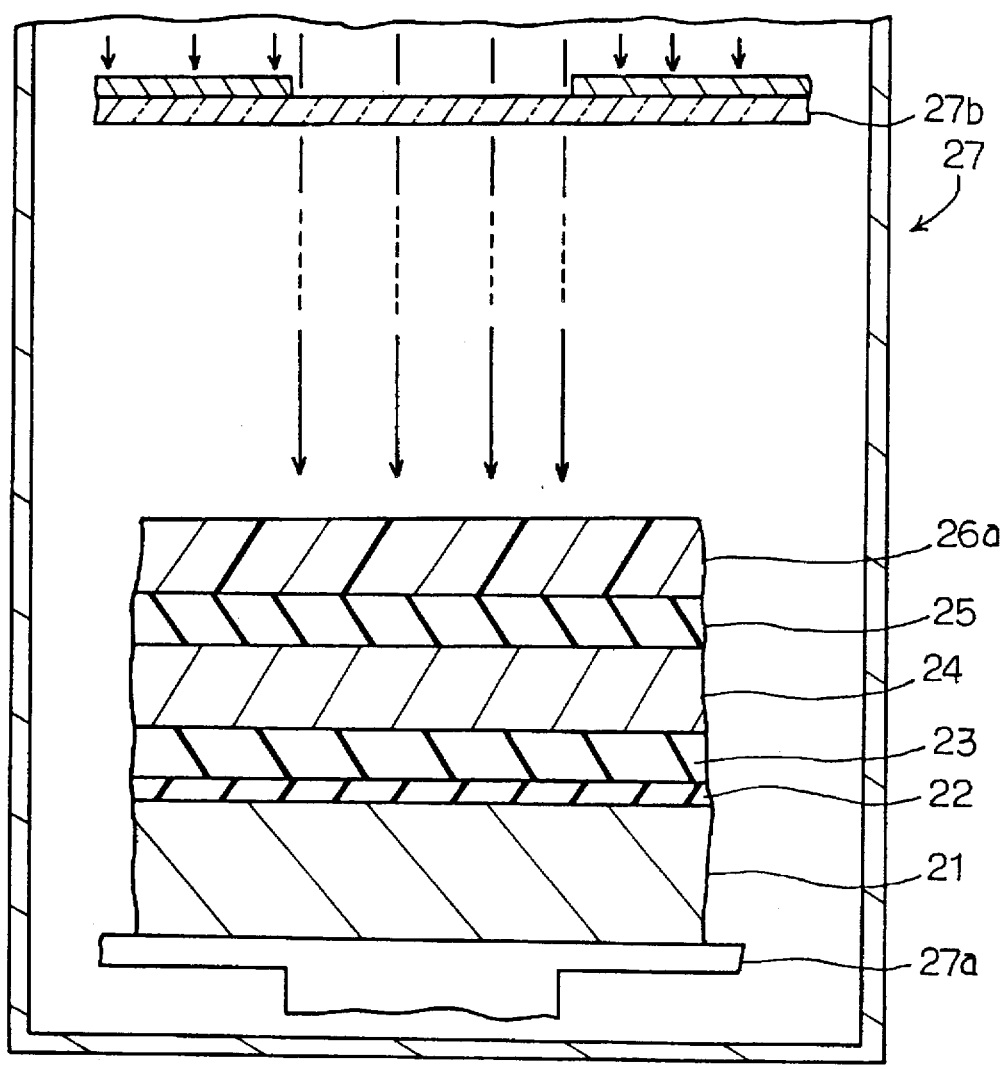
FIGS. 4A to 4E are cross sectional views showing a process sequence for forming an isolating region according to the present invention.

Photo-resist is spread over the entire surface of the second silicon nitride layer 25, and the second silicon nitride layer 25 is overlain by a photo-resist layer 26a. The p-type silicon substrate 21 is placed on a stage 27a of an aligner 27, and a reticle 27b is moved to a space over the photo-resist layer 24a. Light is radiated through the reticle 27b as shown in FIG. 4A, and the pattern for an isolating region is transferred from the reticle 27a to the photo-resist layer 26a.

The resultant structure is taken out from the aligner 27. When the photo-resist layer 26a is developed, the photo-resist layer 26a is patterned into a photo-resist etching mask 26b.

Figure 4B:
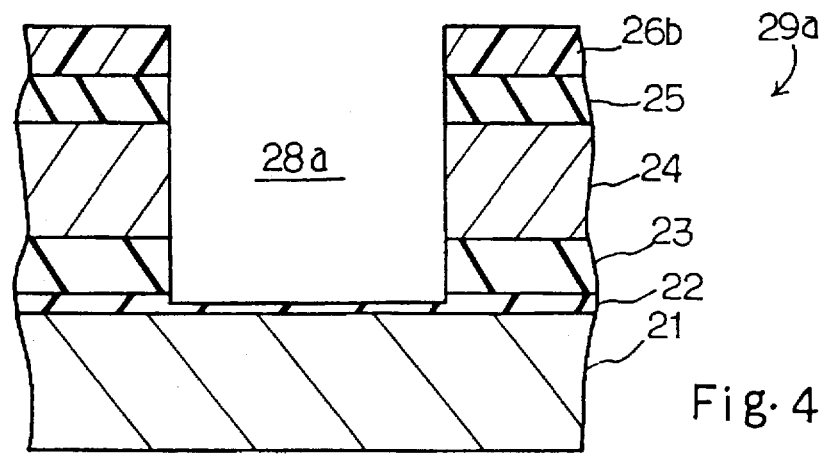

Using the photo-resist etching mask 26b, the second silicon nitride layer 25, the polysilicon layer 25 and the first silicon nitride layer 23 are successively patterned by using dry etching techniques, and the thin silicon oxide pad layer 22 is partially exposed to a primary opening 28a formed in the first silicon nitride layer 23, the polysilicon layer 24 and the second silicon nitride layer 25 as shown in FIG. 4B. The first silicon nitride layer 23, the polysilicon layer 24 and the second silicon nitride layer 25 thus patterned form in combination a protection mask 29 against an oxidation atmosphere.

Figure 4C:
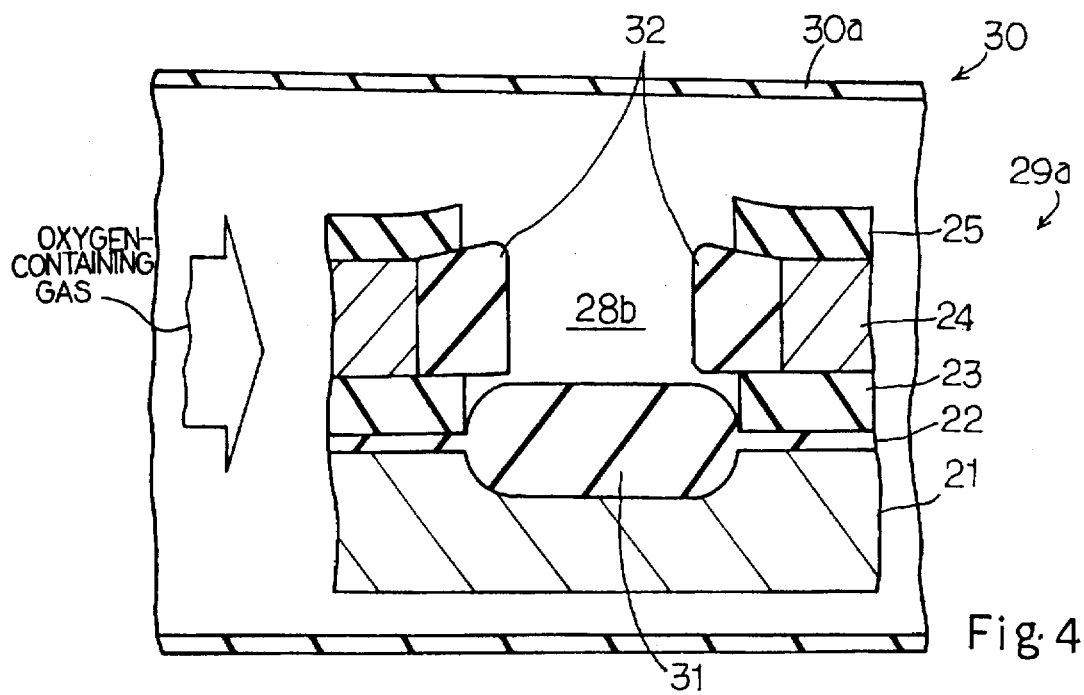

The photo-resist etching mask 26b is stripped off, and the p-type silicon substrate 21 is placed in a furnace tube 30a of an oxidizing system 30. Oxygen-containing gas is introduced into the furnace tube 30a, and the thin silicon oxide pad layer 22 and the inner surface of the polysilicon layer 24 are exposed to the oxygen-containing gas. The silicon beneath the thin silicon oxide pad layer 22 and the polysilicon react with the oxygen. The silicon oxide is thermally grown on the inner surface of the polysilicon layer 24 and the exposed area of the thin silicon oxide pad layer 22, and a thick field oxide layer 31 of 300 nanometers thick and an obstacle loop layer 32 of 150 nanometers wide are concurrently formed on the exposed area of the thin silicon oxide pad layer 22 and the inner surface of the polysilicon layer 24 as shown in FIG. 4C. The silicon oxide is increased in volume, and the thin silicon oxide pad layer 22 partially swells into the thick field oxide layer 31. Similarly, the obstacle loop layer 32 inwardly projects from the original inner surface of the polysilicon layer 24. For this reason, the primary opening 28a is narrowed to a secondary opening 28b, and the first and second silicon nitride layers 23/25, the polysilicon layer 24 and the obstacle loop layer 32 as a whole constitute an ion-implantation mask 29b. However, the first and second silicon nitride layers 23 and 25 prevents the p-type silicon substrate 21 therebeneath from the oxygen, and the oxygen-containing gas does not increase the thickness of the thin silicon oxide pad layer 22 covered with the first silicon nitride 23.

Figure 4D:
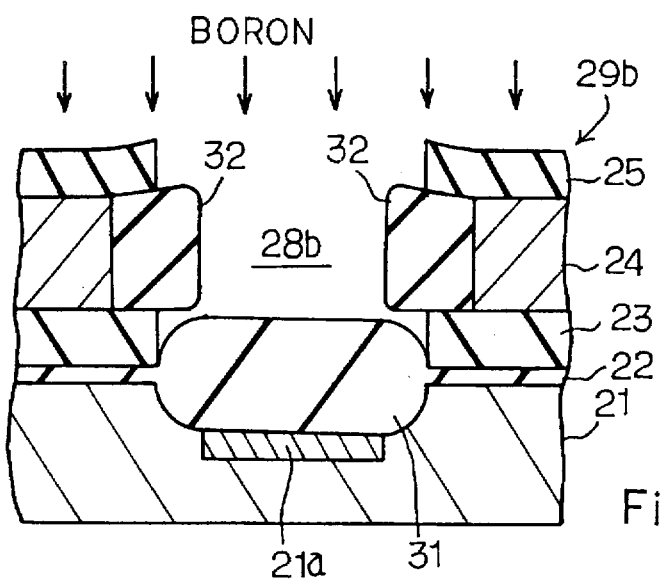

The resultant structure is taken out from the furnace tube 30a, and is placed in an ion-implantation system (not shown). Boron is ion implanted through the thick field oxide layer 31 exposed to the secondary opening 28b into the p-type silicon substrate 21 at dose of $2\times10^{12}$ cm$^{-2}$ under the acceleration energy of 100 KeV. The ion-implantation mask 29b prevents the p-type silicon substrate 21 uncovered with the thick field oxide layer 31 from the boron, and allows the boron to pass through the secondary opening 28b only. The boron reaches the p-type silicon substrate 21 beneath the thick field oxide layer 31 exposed to the secondary opening 28b, and the implanted boron forms a heavily doped p-type channel stopper region 21a beneath the thick field oxide layer 31 as shown in FIG. 4D.

As described hereinbefore, the obstacle loop layer 32 is formed through the reaction between the polysilicon and the oxygen, and inwardly projects from the inner surface of the polysilicon layer 24 into the primary opening 28a. For this reason, the secondary opening 28b is perfectly nested in the primary opening 28a. The primary opening 28a defines the thick field oxide layer 31, and the secondary opening 28b defines the heavily-doped p-type channel stopper region 21a. For this reason, the heavily-doped p-type channel stopper region 21a is exactly nested in the area occupied by the thick field oxide layer 31.

The tolerance between the periphery of the thick field oxide layer 31 and the periphery of the channel stopper region 21a is regulable by changing the thickness of the polysilicon layer 24.

Figure 4E:
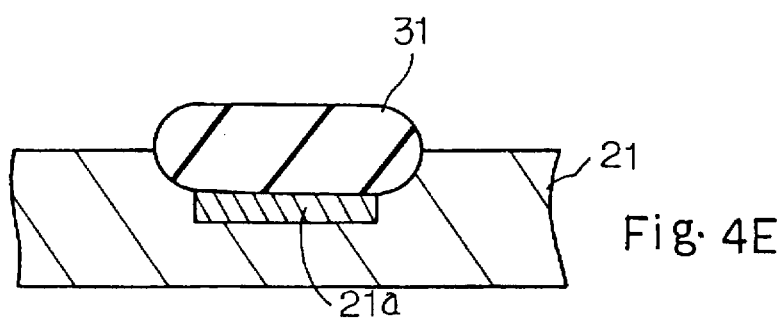

Finally, the second silicon nitride layer 25, the polysilicon layer 24 and the first silicon nitride layer 23 are successively etched in hot phosphoric acid, etching solution containing hydrofluoric acid and nitric acid and the hot phosphoric acid, and the obstacle loop member 32 is removed during the wet etching on the first silicon nitride layer 23. The isolating structure, i.e., the thick field oxide layer 31 and the heavily-doped p-type channel-stopper region 21a are left in the isolating region of the p-type silicon substrate 21 as shown in FIG. 4E.

As will be appreciated from the foregoing description, by virtue of the ion-implantation mask 29b formed on the basis of the protection mask 29a, the heavily-doped p-type channel stopper region 21a is exactly formed beneath the thick field oxide layer 31, and is never exposed to the major surface of the p-type silicon substrate 21. Moreover, the ion-implantation of the boron is carried out after the growth of the thick field oxide layer 31, and the heavily-doped p-type channel stopper region 21a maintains the dopant concentration.

In the process implementing the first embodiment, the thin silicon oxide pad layer 22, the first silicon nitride layer 23, the polysilicon layer 24 and the second silicon nitride layer 25 as a whole constitute a laminated structure.

The present inventor evaluated the process implementing the first embodiment as follows. The present inventor fabricated a 4-mega bit dynamic random access memory device on active areas defined by the thick field oxide layer 31 and the channel stopper region 21a, and measured variation of the component field effect transistors of the 4-mega bit dynamic random access memory device. The threshold of all of the component field effect transistors fell within an acceptable range.

The present inventor further fabricated a 4-mega bit dynamic random access memory device on active areas defined by the thick field oxide layer 15 and the channel stopper region 11a formed through the prior art process illustrated in FIGS. 2A to 2F. The thresholds of the component field effect transistors were also measured. However, defective field effect transistors took place at 20 percent.

Thus, the present inventor confirmed the superiority of the process according to the present invention over the prior art process.

Second Embodiment

FIGS. 5A to 5E illustrates another process sequence embodying the present invention. The process sequence starts with preparation of a p-type silicon substrate 41, and a thin silicon oxide pad layer 42 is thermally grown to 40 nanometers thick on the major surface of the p-type silicon substrate 31. Using chemical vapor deposition techniques, polysilicon is grown to 150 nanometers thick so as to cover the thin silicon oxide pad layer 42 with a polysilicon layer 43, and silicon nitride is deposited to 300 nanometers thick so as to cover the polysilicon layer 43 with a silicon nitride layer 44. Photo-resist is spread over the entire surface of the silicon nitride layer 44, and the silicon nitride layer 44 is overlain by a photo-resist layer 45.

Figure 5A:
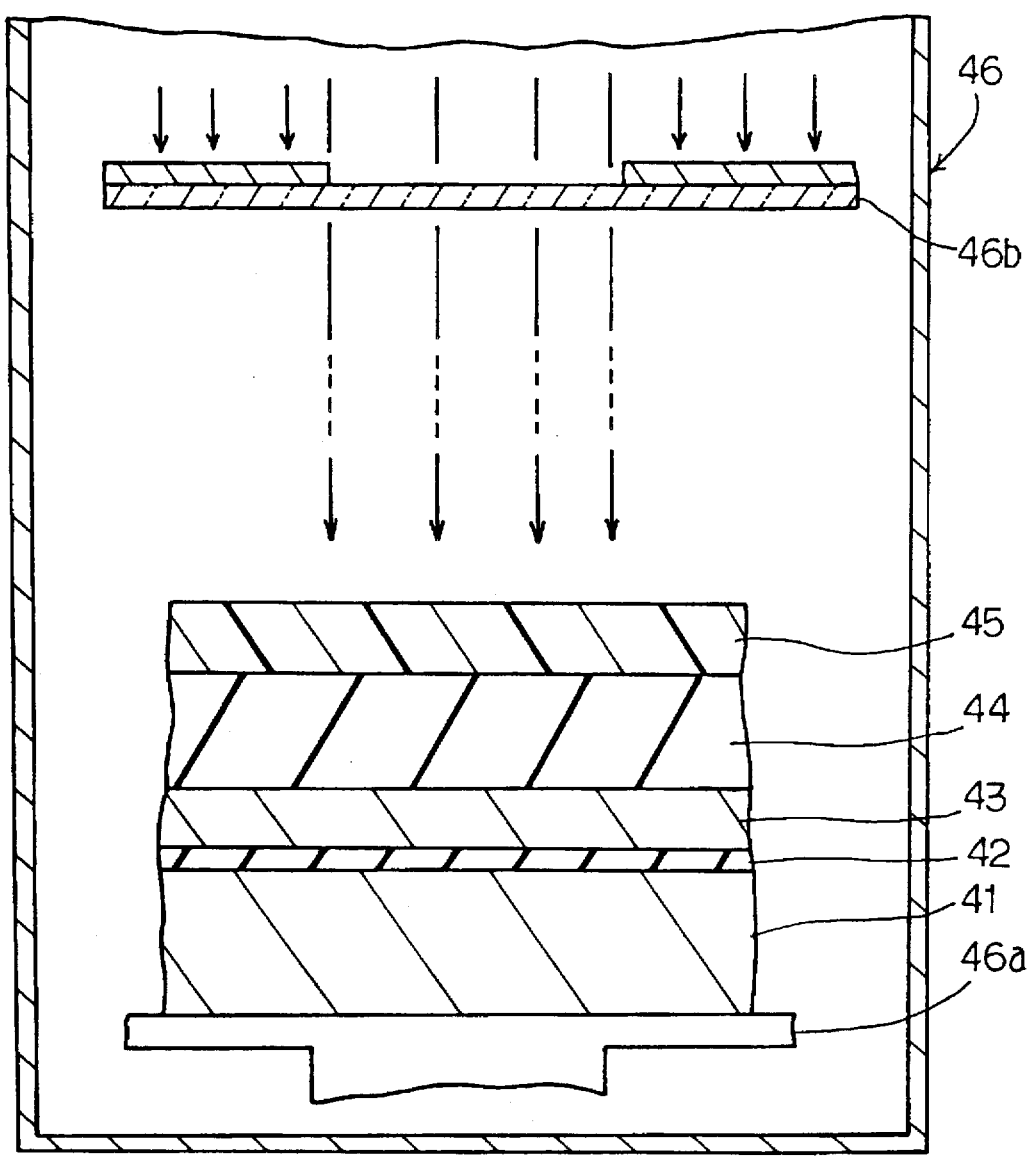
FIGS. 5A to 5E are cross sectional views showing another process sequence for forming an isolating region according to the present invention.

The p-type silicon substrate 41 is placed on a stage of an aligner 46, and a reticle 46b is moved to a space over the photo-resist layer 45. Light is radiated through the reticle 46b to the photo-resist layer 45 as shown in FIG. 5A, and a pattern image for an isolating region is transferred from the reticle 46b to the photo-resist layer 45.

Figure 5B:
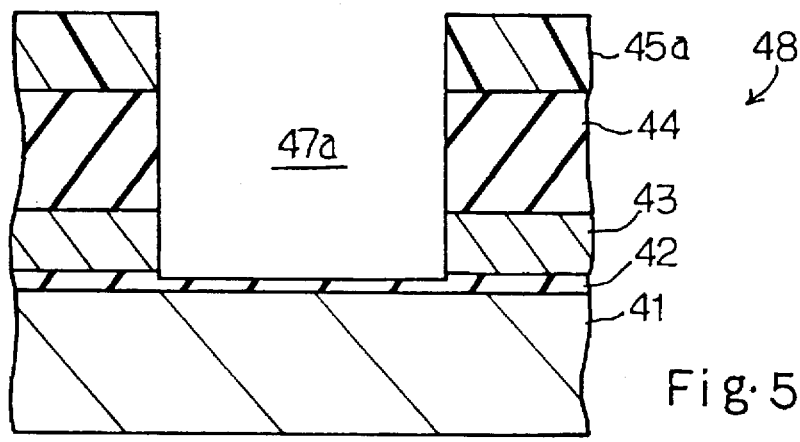

The p-type silicon substrate 41 is taken out from the aligner 46, and the photo-resist layer 45 is developed into a photo-resist etching mask 45a. Using the photo-resist etching mask 45a, the silicon nitride layer 44 and the polysilicon layer 43 are successively patterned by using dry etching techniques, and a first opening 47a is formed in the polysilicon layer 43 and the silicon nitride layer 44 as shown in FIG. 5B. The patterned polysilicon layer 43 and the patterned silicon nitride layer 44 form an ion-implantation mask 48, and the thin silicon oxide pad layer 42 over an area assigned to a channel stopper is exposed to the first opening 47a.

Figure 5C:
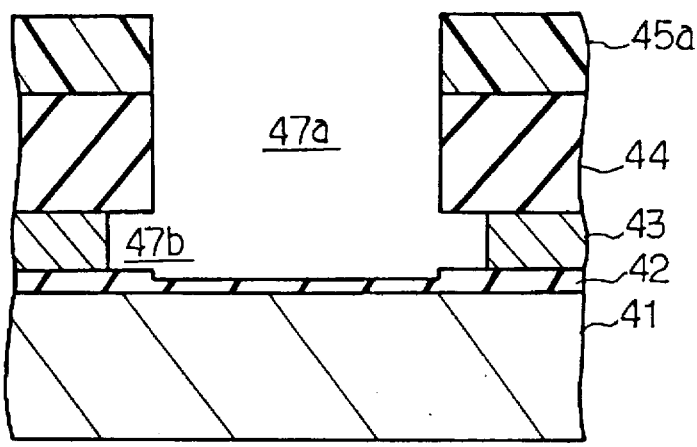

Subsequently, an inner side surface of the polysilicon layer 43 is exposed to the first opening 47a, and an etching solution containing hydrofluoric acid and nitric acid selectively removes the inner surface portion of the polysilicon layer 43 by 150 nanometers wide. As a result, a second opening 47b is formed in the polysilicon layer 43 as shown in FIG. 5C, and the thin silicon oxide pad layer 42 over an area assigned to a thick field oxide layer is exposed to the second opening 47b.

The photo-resist etching mask 45a is stripped off, and the area assigned to the thick field oxide layer is exposed through the thin silicon oxide pad layer 42 to oxygen containing atmosphere. The oxygen is diffused through the thin silicon oxide pad layer 42, and reacts with the silicon. The thick field oxide layer 48 is thermally grown to 300 nanometers thick on the p-type silicon substrate 41, and the second opening 47b allows the thick field oxide layer 48 to expand therein.

Figure 5D:
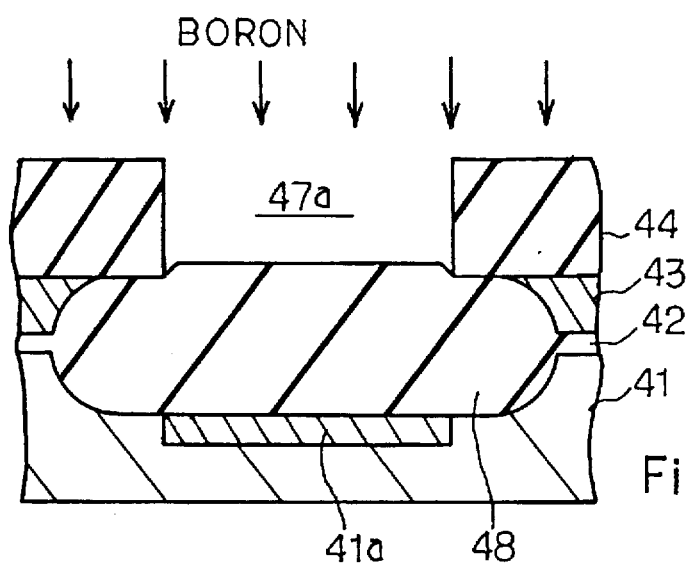

Boron is ion implanted through the thick field oxide layer 48 into the area assigned to the channel stopper at dose of $2\times10^{12}$ cm$^{-2}$ under acceleration energy of 100 KeV, and forms a heavily doped p-type channel stopper region 41a as shown in FIG. 5D.

The first opening 47a is partially expanded through the wet etching on the polysilicon layer 43 so as to form the second opening 47b. The first opening 47a defines the area assigned to the heavily-doped p-type channel stopper region 41a, and the second opening 47b defines the area assigned to the thick field oxide layer 48. For this reason, the area assigned to the channel stopper region 41a is exactly nested in the area assigned to the thick field oxide layer 48, and the heavily-doped p-type channel-stopper region 41a is never exposed to the major surface of the p-type silicon substrate 41 outside of the thick field oxide layer 48.

Moreover, the heavily-doped p-type channel-stopper region 41a is never affected by the heat during the growth of the thick field oxide layer 48, and maintains the dopant concentration.

Figure 5E:
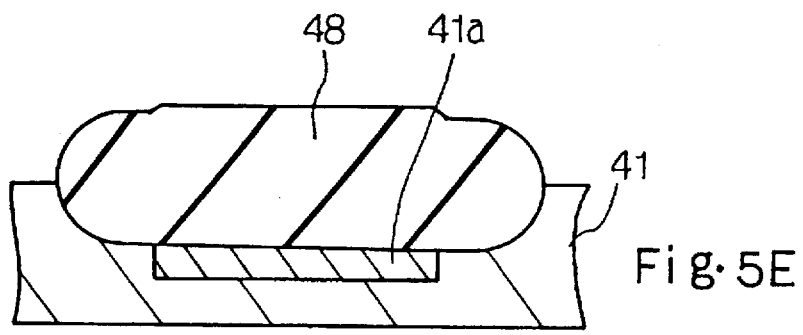

Finally, the silicon nitride layer 44 is etched away in hot phosphoric acid solution, and the polysilicon layer 43 is removed in an etching solution containing the hydrofluoric acid and the nitric acid. The thin silicon oxide pad layer 42 is further etched away in hydrofluoric acid solution. As a result, the thick field oxide layer 48 and the heavily doped p-type channel stopper region 41a are left in the p-type silicon substrate 41 as shown in FIG. 5E, and form in combination an electrical isolation.

The advantages of the first embodiment are also achieved through the process implementing the second embodiment, and the second process is simpler than the first process, because the thin silicon oxide pad layer 42, the polysilicon layer 43 and the silicon nitride layer 44 form in combination the laminated structure.

The first opening 47a is defined through the lithographic techniques, and the lithographic techniques precisely defines the area assigned to the channel stopper rather than the growth of the obstacle loop layer 32.

Although particular embodiments of the present invention have been shown and described, it will be obvious to those skilled in the art that various changes and modifications may be made without departing from the spirit and scope of the present invention.

For example, the protection mask 29a of the first embodiment is implemented by the laminated structure of the polysilicon layer 24 sandwiched between the first and second silicon nitride layers 23 and 25. However, any combination of an oxidizable layer and oxygen non-diffusable layers is available for the protection mask 29a.

A heavily doped n-type channel stopper region may be formed in an n-type silicon substrate or an n-type well beneath a thick field oxide layer, and the semiconductor layer or substrate is not limited to silicon.

In the second embodiment, the polysilicon layer 43 and the silicon nitride layer 44 forms the laminated structure. However, any two materials are available in so far as there is an etchant having a selectivity between these two materials.

What is claimed is:

1. A process of forming an electrical isolation in a semiconductor layer of a first oxidizable material, comprising the steps of:

a) forming a laminated structure including at least a first layer of a second oxidizable material and a second layer of an oxygen non-diffusable material over said semiconductor layer;

b) patterning said laminated structure into a protection mask against an oxidation atmosphere having a first opening over a first area of said semiconductor layer assigned to a field oxide layer;

c) exposing said semiconductor layer covered with said protection mask to an oxidation atmosphere so as to grow said field oxide layer on said first area and an obstacle layer on an inner surface of said first layer, said obstacle layer defining a second opening over a second area nested in said first area;

d) ion implanting a dopant impurity through said field oxide layer into said second area by using said protection mask and said obstacle layer as an ion-implantation mask so as to form a channel stopper beneath said field oxide layer; and e) removing said ion-implantation mask from said semiconductor layer so as to leave said field oxide layer and said channel stopper in said semiconductor layer.

2. The process as set forth in claim 1, in which said second layer has two sub-layers where said first layer is sandwiched, and said laminated structure further includes a pad layer between said semiconductor layer and one of said two sub-layers.

3. The process as set forth in claim 2, in which a part of said pad layer over said first area is exposed to said first opening.

4. The process as set forth in claim 3, in which said step b) includes the sub-steps of:

b-1) covering the other of said two sub-layers with a photo-resist layer;

b-2) transferring a pattern image for said first opening from a reticle to said photo-resist layer;

b-3) developing said photo-resist layer into a photo-resist etching mask; and b-4) partially etching said other of said two sub-layers, said first layer and said one of said two sublayers so as to form said first opening.

5. The process as set forth in claim 1, in which said first oxidizable material, said second oxidizable material and said oxygen non-diffusable material are single crystal silicon, polysilicon and silicon nitride.

6. The process as set forth in claim 5, in which said laminated structure further includes a pad layer of silicon oxide on said semiconductor layer of said single crystal silicon, and said second layer has two sub-layers for sandwiching said first layer of said polysilicon therebetween, an inner peripheral portion of said first layer and said first area of said semiconductor layer being thermally oxidized by exposing to an oxygen-containing atmosphere.

7. A process of forming an electrical isolation in a semiconductor layer of an oxidizable material, comprising the steps of:

a) forming a laminated structure including a first layer of an oxygen non-diffusable material and a second layer of a material different from said oxygen non-diffusable material between said semiconductor layer and said first layer;

b) patterning said laminated structure into an ion-implantation mask having a first opening over a first area of said semiconductor layer assigned to a channel stopper;

c) etching an inner peripheral portion of said second layer exposed to said first opening so as to expand a part of said first opening to a second opening over a second area of said semiconductor layer assigned to a field oxide layer, said first area being nested in said second area;

d) growing said field oxide layer on said second area by exposing said semiconductor layer covered with said ion-implantation mask to an oxidizing atmosphere;

e) ion implanting a dopant impurity through said field oxide layer into said first area so as to form said channel stopper beneath said field oxide layer; and f) removing said ion-implantation mask from said semiconductor layer so as to leave said field oxide layer and said channel stopper in said semiconductor layer.

8. The process as set forth in claim 7, in which said oxidizable material and said oxygen non-diffusable material are single crystal silicon and silicon nitride.

9. The process as set forth in claim 8, in which said material for said second layer is polysilicon.

10. The process as set forth in claim 9, in which said laminated structure further includes a pad layer of silicon oxide between said semiconductor layer and said second layer, and said step b) includes the sub-steps of b-1) covering said first layer with a photo-resist layer, b-2) transferring a pattern image for said first opening from a reticle to said photo-resist layer;

b-3) developing said photo-resist layer into a photo-resist etching mask; and b-4) partially etching said first layer and said second layer so as to form said first opening.

* * * * *